United States Patent
Lee

(10) Patent No.: US 10,269,398 B2
(45) Date of Patent: Apr. 23, 2019

(54) ELECTRONIC DEVICES INCLUDING LOGIC OPERATORS TO PREVENT MALFUNCTION

(71) Applicant: SK hynix Inc., Icheon-si, Gyeonggi-do (KR)

(72) Inventor: Jae In Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/715,946

(22) Filed: Sep. 26, 2017

(65) Prior Publication Data

US 2018/0308531 A1 Oct. 25, 2018

(30) Foreign Application Priority Data

Apr. 24, 2017 (KR) .................. 10-2017-0052568

(51) Int. Cl.
| | |
|---|---|
| *G11C 8/10* | (2006.01) |
| *G11C 8/18* | (2006.01) |
| *G11C 7/22* | (2006.01) |
| *G06F 13/16* | (2006.01) |
| *G11C 7/10* | (2006.01) |

(52) U.S. Cl.
CPC .......... *G11C 7/222* (2013.01); *G06F 13/1668* (2013.01); *G11C 7/109* (2013.01); *G11C 8/10* (2013.01); *G11C 8/18* (2013.01); *G11C 2207/22* (2013.01)

(58) Field of Classification Search
CPC .................................. G11C 8/10; G11C 8/18
USPC ........................................ 365/230.06, 230.08
See application file for complete search history.

(56) References Cited

U.S. PATENT DOCUMENTS

| | | | | |
|---|---|---|---|---|
| 5,590,088 A | * | 12/1996 | Sakurada | G11C 7/22 365/194 |
| 5,787,045 A | * | 7/1998 | Lee | G11C 11/406 365/230.01 |
| 6,243,319 B1 | * | 6/2001 | Yokozeki | G11C 5/025 365/189.08 |
| 6,765,423 B2 | * | 7/2004 | Higuchi | G11C 7/1078 327/270 |
| 7,379,376 B2 | * | 5/2008 | Oh | G11C 8/18 365/230.06 |
| 8,031,535 B2 | * | 10/2011 | Lee | G11C 7/1078 365/189.05 |
| 2006/0214820 A1 | | 9/2006 | Kleihorst et al. | |

FOREIGN PATENT DOCUMENTS

KR 1020160068369 A 6/2016

* cited by examiner

*Primary Examiner* — Son L Mai
(74) *Attorney, Agent, or Firm* — William Park & Associates Ltd.

(57) ABSTRACT

An electronic device may include a pulse delay circuit and a logic circuit. The pulse delay circuit generates an input control pulse based on a command pulse. The logic circuit may be configured to output some input signals from a plurality of input signals as transmitted input signals based on the input control pulse while the input signals maintain a certain logic level combination. The logic circuit may be configured to perform a predetermined logical operation of the transmitted input signals according to a remaining input signal from the plurality of input signals to generate an output signal.

18 Claims, 15 Drawing Sheets

| INT1·INT2 / IN3 | 00 | 01 | 11 | 10 |
|---|---|---|---|---|
| 0 | 0 | 1 | 0 | 1 |
| 1 | 1 | 0 | 1 | 0 |

US 10,269,398 B2

ELECTRONIC DEVICES INCLUDING LOGIC OPERATORS TO PREVENT MALFUNCTION

CROSS-REFERENCE TO RELATED APPLICATIONS

The present application claims priority under 35 U.S.C 119(a) to Korean Application No. 10-2017-0052568, filed on Apr. 24, 2017, which is incorporated herein by reference in its entirety.

BACKGROUND

1. Technical Field

Embodiments of the present disclosure may generally relate to electronic devices, and more particularly, to electronic devices including logic operators.

2. Related Art

Electronic devices such as semiconductor devices transform all data into binary numbers therein to efficiently process the data. Accordingly, the electronic devices may include various logic operators to perform logical operations of the binary numbers expressed by a logic "low" level and a logic "high" level.

SUMMARY

According to an embodiment, an electronic device may be provided. The electronic device may include a pulse delay circuit and a logic circuit. The pulse delay circuit may be configured to generate an input control pulse based on a command pulse. The logic circuit may be configured to output some input signals from a plurality of input signals as transmitted input signals based on the input control pulse while the input signals maintain a certain logic level combination. The logic circuit may be configured to perform a predetermined logical operation of the transmitted input signals according to a remaining input signal from the plurality of input signals to generate an output signal.

According to an embodiment, an electronic device may be provided. The electronic device may include a first pulse delay circuit configured to generate a first input control pulse based on a command pulse. The electronic device may include a second pulse delay circuit configured to generate a second input control pulse based on the first input control pulse. The electronic device may include a first logic circuit configured to perform a predetermined logical operation of first to third input signals in synchronization with the first input control pulse to generate a first output signal. The electronic device may include a second logic circuit configured to perform a predetermined logical operation of fourth to sixth input signals in synchronization with the first input control pulse to generate a second output signal. The electronic device may include a third logic circuit configured to perform a predetermined logical operation of seventh to ninth input signals in synchronization with the first input control pulse to generate a third output signal. The electronic device may include a fourth logic circuit configured to perform a predetermined logical operation of the first to third output signals in synchronization with the second input control pulse to generate a fourth output signal.

BRIEF DESCRIPTION OF THE DRAWINGS

FIG. 7 is a table illustrating an operation of the logic circuit illustrated in FIG. 4.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, a logic high or logic low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Figure 1:
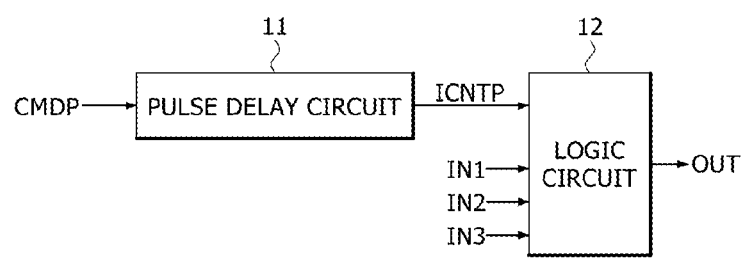
FIG. 1 is a block diagram illustrating a configuration of an electronic device according to an embodiment of the present disclosure.

Referring to FIG. 1, an electronic device according to an embodiment may include a pulse delay circuit 11 and a logic circuit 12.

The pulse delay circuit 11 may generate an input control pulse ICNTP in response to a command pulse CMDP. The command pulse CMDP may be a signal that is generated to perform one of various operations. For example, the command pulse CMDP may be generated to perform a write operation or a read operation. The pulse delay circuit 11 may generate the input control pulse ICNTP at a point of time that a predetermined delay time elapses from a point of time that the command pulse CMDP is created. A configuration and an operation of the pulse delay circuit 11 will be described more fully with reference to FIGS. 2 and 3 later.

The logic circuit 12 may generate an output signal OUT from a first input signal IN1, a second input signal IN2 and a third input signal IN3, in response to the input control pulse ICNTP. The logic circuit 12 may buffer the first and second input signals IN1 and IN2 and may perform a predetermined logical operation of the third input signal IN3 and the buffered first and second input signals to generate the output signal OUT, in response to the input control pulse ICNTP. In an embodiment, for example, the logic circuit 12 may be configured to output some input signals as transmitted input signals based on the input control pulse ICNTP while the input signals maintain a certain logic level combination. In an embodiment, for example, the logic circuit 12 may be configured to perform a predetermined logical operation of the transmitted input signals according to a remaining input signal among the input signals to generate an output signal OUT. In an embodiment, for example, the logic circuit 12 may be conjured to output some input signals (i.e., IN1 and IN2) from a plurality of input signals (i.e., IN1-IN3) as transmitted input signals (i.e., INT1-INTB2) based on the input control pulse ICNTP while the input signals (i.e., IN1-IN3) maintain a certain logic level combination. In an embodiment, for example, the logic circuit 12 may be configured to perform a predetermined logical operation of the transmitted input signals (i.e., INT1-INTB2) according to a remaining input signal (i.e., IN3) from the plurality of input signals (i.e., IN1-IN3) to generate an output signal OUT. A configuration and an operation of the logic circuit 12 will be described more fully with reference to FIGS. 4 to 7 later.

Figure 2:
FIG. 2 is a circuit diagram illustrating an example of a pulse delay circuit included in the electronic device of FIG. 1.

Referring to FIG. 2, a pulse delay circuit 11a corresponding to an example of the pulse delay circuit 11 may be realized using, an inversion operator for example but not limited to, an inverter chain circuit including a plurality of inverters which are connected in series. The number of the inverters included in the pulse delay circuit 11a may be set to be different according to the embodiments. The input control pulse ICNTP may be generated at a point of time that a delay time set by the pulse delay circuit 11a elapses from a point of time that the command pulse CMDP is created.

Figure 3:
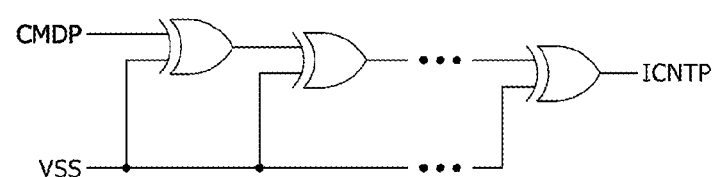
FIG. 3 is a circuit diagram illustrating an example of a pulse delay circuit included in the electronic device of FIG. 1.

Referring to FIG. 3, a pulse delay circuit 11b corresponding to an example of the pulse delay circuit 11 may be realized to include, an exclusive OR operator for example but not limited to, a plurality of exclusive OR gates. The plurality of exclusive OR gates included in the pulse delay circuit 11b may be coupled in series, and one of two input terminals of each exclusive OR gate may be coupled to a ground voltage VSS terminal. Thus, the first one of the plurality of exclusive OR gates included in the pulse delay circuit 11b may directly receive the command pulse CMDP and the ground voltage VSS to perform an exclusive OR operation of the command pulse CMDP and the ground voltage VSS, and each of the second to last exclusive OR gates may receive an output signal of the previous exclusive OR gate and the ground voltage VSS to perform an exclusive OR operation of the output signal of the previous exclusive OR gate and the ground voltage VSS. Accordingly, the plurality of exclusive OR gates included in the pulse delay circuit 11b may act as buffers. The number of the plurality of exclusive OR gates included in the pulse delay circuit 11b may be set to be different according to the embodiments. The input control pulse ICNTP may be generated at a point of time that a delay time set by the pulse delay circuit 11a elapses from a point of time that the command pulse CMDP is created.

Figure 4:
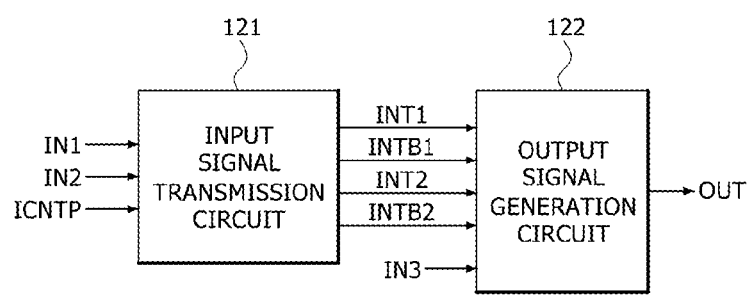
FIG. 4 is a block diagram illustrating an example of a logic circuit included in the electronic device of FIG. 1.

Referring to FIG. 4, the logic circuit 12 may include an input signal transmission circuit 121 and an output signal generation circuit 122.

The input signal transmission circuit 121 may generate a first transmitted input signal INT1, a first complementary transmitted input signal INTB1, a second transmitted input signal INT2 and a second complementary transmitted input signal INTB2 from the first and second input signals IN1 and IN2, in response to the input control pulse ICNTP. The input signal transmission circuit 121 may output the first and second input signals IN1 and IN2 as the first and second transmitted input signals INT1 and INT2 in synchronization with a point of time that the input control pulse ICNTP is created. The input signal transmission circuit 121 may inversely buffer the first and second transmitted input signals INT1 and INT2 to generate the first and second complementary transmitted input signals INTB1 and INTB2, in synchronization with a point of time that the input control pulse ICNTP is created.

The output signal generation circuit 122 may generate the output signal OUT in response to the first transmitted input signal INT1, the first complementary transmitted input signal INTB1, the second transmitted input signal INT2, the second complementary transmitted input signal INTB2 and the third input signal IN3. The output signal generation circuit 122 may receive the first transmitted input signal INT1, the second transmitted input signal INT2 and the third input signal IN3 and may perform an exclusive OR operation of the first transmitted input signal INT1, the second transmitted input signal INT2 and the third input signal IN3 to generate the output signal OUT.

Figure 5:
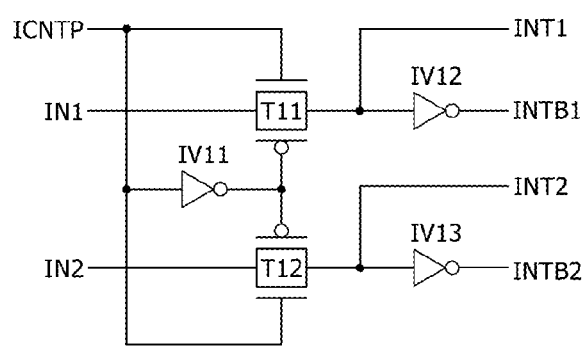
FIG. 5 is a circuit diagram illustrating an example of an input signal transmission circuit included in the logic circuit of FIG. 4.

Referring to FIG. 5, the input signal transmission circuit 121 may include transfer gates T11 and T12 and inversion operators, for example but not limited to, inverters IV11, IV12 and IV13. The inverter IV11 may inversely buffer the input control pulse ICNTP to output the inversely buffered input control pulse as an output signal thereof. The transfer gate T11 may be turned on in response to the input control pulse ICNTP and the output signal of the inverter IV11 to output the first input signal IN1 as the first transmitted input signal INT1. The transfer gate T12 may be turned on in response to the input control pulse ICNTP and the output signal of the inverter IV11 to output the second input signal IN2 as the second transmitted input signal INT2. The inverter IV12 may inversely buffer the first transmitted input signal INT1 to generate the first complementary transmitted input signal INTB1. The inverter IV13 may inversely buffer the second transmitted input signal INT2 to generate the second complementary transmitted input signal INTB2. The input signal transmission circuit 121 may output the first and second input signals IN1 and IN2 as the first and second transmitted input signals INT1 and INT2 through the transfer gates T11 and T12 which are turned on at a point of time that the input control pulse ICNTP is created. The input signal transmission circuit 121 may inversely buffer the first and second transmitted input signals INT1 and INT2 to generate the first and second complementary transmitted input signals INTB1 and INTB2.

Figure 6:
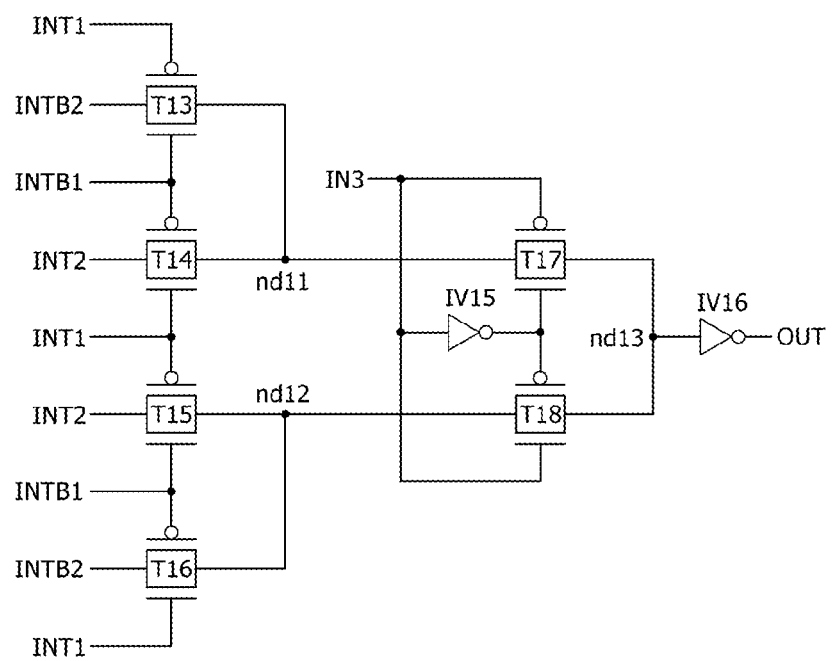
FIG. 6 is a circuit diagram illustrating an example of an output signal generation circuit included in the logic circuit of FIG. 4.

Referring to FIG. 6, the output signal generation circuit 122 may include transfer gates T13, T14, T15, T16, T17 and T18 and inversion operators, for example but not limited to, inverters IV15 and IV16. The transfer gate T13 may be turned on in response to the first transmitted input signal INT1 and the first complementary transmitted input signal INTB1 to output the second complementary transmitted input signal INTB2 to a node nd11. The transfer gate T14 may be turned on in response to the first transmitted input signal INT1 and the first complementary transmitted input signal INTB1 to output the second transmitted input signal INT2 to the node nd11. The transfer gate T15 may be turned on in response to the first transmitted input signal INT1 and the first complementary transmitted input signal INTB1 to output the second transmitted input signal INT2 to a node nd12. The transfer gate T16 may be turned on in response to the first transmitted input signal INT1 and the first complementary transmitted input signal INTB1 to output the second complementary transmitted input signal INTB2 to the node nd12. The inverter IV15 may inversely buffer the third input signal IN3 to output the inversely buffered third input signal as an output signal thereof. The transfer gate T17 may be turned on in response to the third input signal IN3 and the output signal of the inverter IV15 to output a signal of the node nd11 to a node nd13. The transfer gate T18 may be turned on in response to the third input signal IN3 and the output signal of the inverter IV15 to output a signal of the node nd12 to the node nd13. The inverter IV16 may inversely buffer a signal of the node nd13 to generate the output signal OUT. The output signal generation circuit 122 may perform an exclusive OR operation of the first transmitted input signal INT1, the second transmitted input signal INT2 and the third input signal IN3 to generate the output signal OUT.

An operation of an electronic device having an aforementioned configuration will be described hereinafter.

The electronic device according to an embodiment may generate the input control pulse ICNTP after a predetermined delay time elapses from a point of time that the command pulse CMDP is created to perform a predetermined operation, for example, a read operation or a write operation. Moreover, the electronic device may generate the first transmitted input signal INT1, the first complementary transmitted input signal INTB1, the second transmitted input signal INT2 and the second complementary transmitted input signal INTB2 from the first and second input signals IN1 and IN2 in synchronization with a point of time that the input control pulse ICNTP is created. In addition, the electronic device may perform an exclusive OR operation of the first transmitted input signal INT1, the second transmitted input signal INT2 and the third input signal IN3 to generate the output signal OUT.

Figure 7:
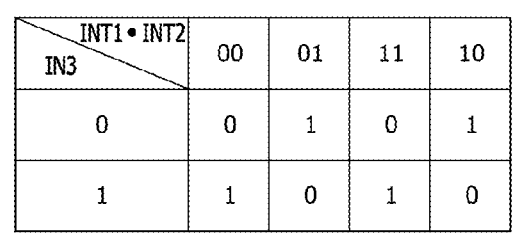

Referring to FIG. 7, after a logic level combination of the first and second transmitted input signals INT1 and INT2 is determined in synchronization with a point of time that the input control pulse ICNTP is created, an exclusive OR operation of the first and second transmitted input signals INT1 and INT2 may be performed according to a logic level of the third input signal IN3 to generate the output signal OUT. After the first and second transmitted input signals INT1 and INT2 are set to have a logic level combination of '00' in synchronization with a point of time that the input control pulse ICNTP is created, the output signal OUT may be generated to have a logic "low(0)" level if a logic level of the third input signal IN3 is a logic "low(0)" level and the output signal OUT may be generated to have a logic "high(1)" level if a logic level of the third input signal IN3 is a logic "high(1)" level. In a logic level combination of the first and second transmitted input signals INT1 and INT2, the logic level combination of '00' means that both of the first and second transmitted input signals INT1 and INT2 have a logic "low(0)" level. After the first and second transmitted input signals INT1 and INT2 are set to have a logic level combination of '01' in synchronization with a point of time that the input control pulse ICNTP is created, the output signal OUT may be generated to have a logic "high(1)" level if a logic level of the third input signal IN3 is a logic "low(0)" level and the output signal OUT may be generated to have a logic "low(0)" level if a logic level of the third input signal IN3 is a logic "high(1)" level. In a logic level combination of the first and second transmitted input signals INT1 and INT2, the logic level combination of '01' means that the first transmitted input signal INT1 has a logic "high(1)" level and the second transmitted input signal INT2 has a logic "low(0)" level. After the first and second transmitted input signals INT1 and INT2 are set to have a logic level combination of '11' in synchronization with a point of time that the input control pulse ICNTP is created, the output signal OUT may be generated to have a logic "low(0)" level if a logic level of the third input signal IN3 is a logic "low(0)" level and the output signal OUT may be generated to have a logic "high(1)" level if a logic level of the third input signal IN3 is a logic "high(1)" level. In a logic level combination of the first and second transmitted input signals INT1 and INT2, the logic level combination of '11' means that both of the first and second transmitted input signals INT1 and INT2 have a logic "high(1)" level. After the first and second transmitted input signals INT1 and INT2 are set to have a logic level combination of '10' in synchronization with a point of time that the input control pulse ICNTP is created, the output signal OUT may be generated to have a logic "high(1)" level if a logic level of the third input signal IN3 is a logic "low(0)" level and the output signal OUT may be generated to have a logic "low(0)" level if a logic level of the third input signal IN3 is a logic "high(1)" level. In a logic level combination of the first and second transmitted input signals INT1 and INT2, the logic level combination of '10' means that the first transmitted input signal INT1 has a logic "low(0)" level and the second transmitted input signal INT2 has a logic "high(1)" level.

As described above, the electronic device according to an embodiment may generate the first transmitted input signal INT1, the first complementary transmitted input signal INTB1, the second transmitted input signal INT2 and the second complementary transmitted input signal INTB2 from the first and second input signals IN1 and IN2 in synchronization with the input control pulse ICNTP which is created after a predetermined delay time elapses from a point of time that the command pulse CMDP is created to perform a read operation, a write operation or the like. Since an exclusive OR operation of the first and second transmitted input signals INT1 and INT2 is performed according to a logic level of the third input signal IN3 after a logic level combination of the first and second transmitted input signals INT1 and INT2 is determined, a logic level transition period of the first and second transmitted input signals INT1 and INT2 may not overlap with a logic level transition period of the third input signal IN3. Thus, the output signal OUT may be generated without any glitch to prevent malfunction of the electronic device. As a result, the electronic device may be realized to stably operate.

Figure 8:
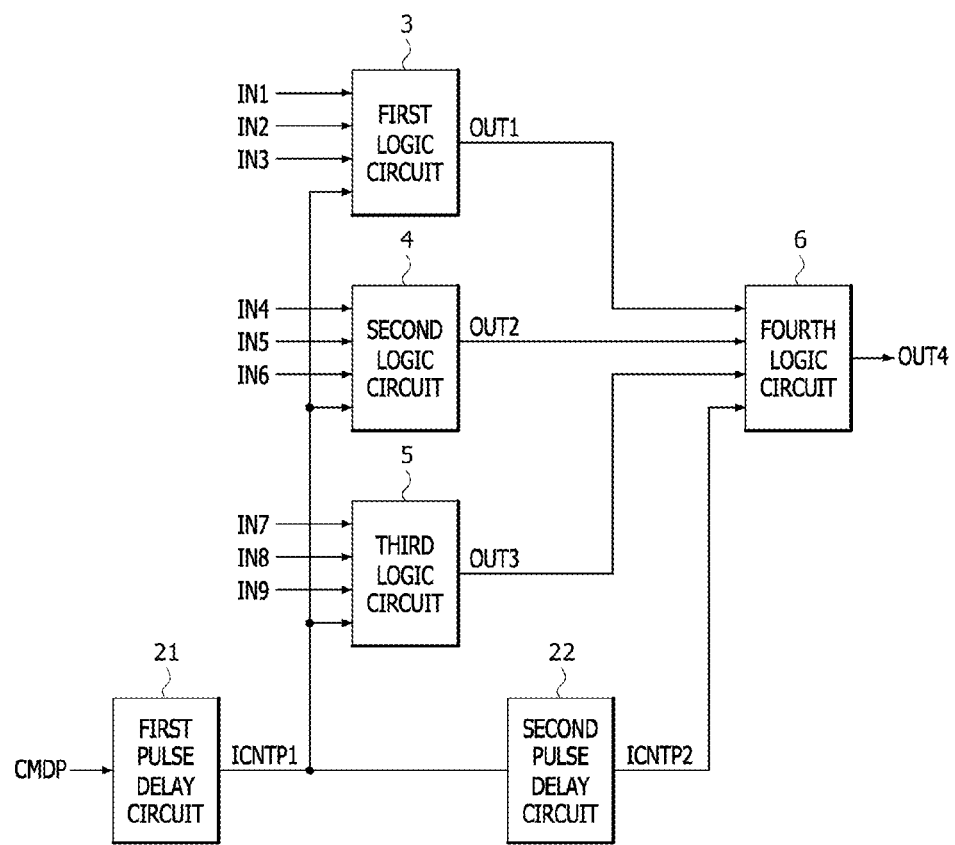
FIG. 8 is a block diagram illustrating a configuration of an electronic device according to an embodiment of the present disclosure.

As illustrated in FIG. 8, an electronic device according to an embodiment may include a first pulse delay circuit 21, a second pulse delay circuit 22, a first logic circuit 3, a second logic circuit 4, a third logic circuit 5, and a fourth logic circuit 6.

The first pulse delay circuit 21 may generate a first input control pulse ICNTP1 in response to a command pulse CMDP. The command pulse CMDP may be a signal that is generated to perform one of various operations. For example, the command pulse CMDP may be generated to perform a write operation or a read operation. The first pulse delay circuit 21 may generate the first input control pulse ICNTP1 at a point of time that a predetermined delay time elapses from a point of time that the command pulse CMDP is created. A configuration and an operation of the first pulse delay circuit 21 will be described with reference to FIGS. 9 and 10 later.

The second pulse delay circuit 22 may generate a second input control pulse ICNTP2 in response to the first input control pulse ICNTP1. The second pulse delay circuit 22 may generate the second input control pulse ICNTP2 at a point of time that a predetermined delay time elapses from a point of time that the first input control pulse ICNTP1 is created. A configuration and an operation of the second pulse delay circuit 22 will be described with reference to FIGS. 9 and 10 later.

The first logic circuit 3 may generate a first output signal OUT1 from a first input signal IN1, a second input signal IN2, and a third input signal IN3 in response to the first input control pulse ICNTP1. The first logic circuit 3 may buffer the first and second input signals IN1 and IN2 and may perform a predetermined logical operation of the third input signal IN3 and the buffered first and second input signals to generate the first output signal OUT1, in response to the first input control pulse ICNTP1. A configuration and an operation of the first logic circuit 3 will be described with reference to FIG. 11 later.

The second logic circuit 4 may generate a second output signal OUT2 from a fourth input signal IN4, a fifth input signal IN5, and a sixth input signal IN6 in response to the first input control pulse ICNTP1. The second logic circuit 4 may buffer the fourth and fifth input signals IN4 and IN5 and may perform a predetermined logical operation of the sixth input signal IN6 and the buffered fourth and fifth input signals to generate the second output signal OUT2, in response to the first input control pulse ICNTP1. A configuration and an operation of the second logic circuit 4 will be described with reference to FIG. 12 later.

The third logic circuit 5 may generate a third output signal OUT3 from a seventh input signal IN7 an eighth input signal IN8, and a ninth input signal IN9 in response to the first input control pulse ICNTP1. The third logic circuit 5 may buffer the seventh and eighth input signals IN7 and IN8 and may perform a predetermined logical operation of the ninth input signal IN9 and the buffered seventh and eighth input signals to generate the third output signal OUT3, in response to the first input control pulse ICNTP1. A configuration and an operation of the third logic circuit 5 will be described with reference to FIG. 13 later.

The fourth logic circuit 6 may generate a fourth output signal OUT4 from the first, second, and third output signals OUT1, OUT2, and OUT3 in response to the second input control pulse ICNTP2. The fourth logic circuit 6 may buffer the first and second output signals OUT1 and OUT2 and may perform a predetermined logical operation of the third output signal OUT3 and the buffered first and second output signals to generate the fourth output signal OUT4, in response to the second input control pulse ICNTP2. A configuration and an operation of the fourth logic circuit 6 will be described with reference to FIG. 14 later.

Figure 9:
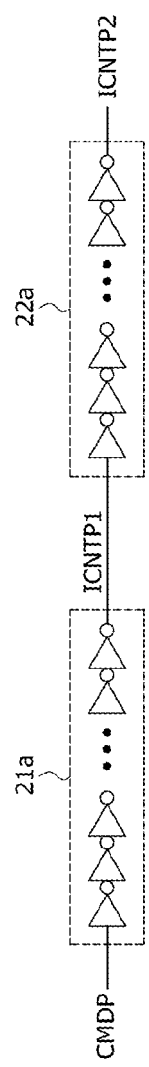
FIG. 9 is a circuit diagram illustrating an example of first and second pulse delay circuits included in the electronic device of FIG. 8.

Referring to FIG. 9, a first pulse delay circuit 21a corresponding to an example of the first pulse delay circuit 21 and a second pulse delay circuit 22a corresponding to an example of the second pulse delay circuit 22 are provided. Each of the first and second pulse delay circuits 21a and 22a may be realized using an inversion operator, for example but not limited to, an inverter chain circuit including a plurality of inverters which are connected in series. The number of the inverters included in each of the first and second pulse delay circuits 21a and 22a may be set to be different according to the embodiments. The first input control pulse ICNTP1 may be generated at a point of time that a delay time set by the first pulse delay circuit 21a elapses from a point of time that the command pulse CMDP is created. The second input control pulse ICNTP2 may be generated at a point of time that a delay time set by the second pulse delay circuit 22a elapses from a point of time that the first input control pulse ICNTP1 is created. In an embodiment, for example, the first pulse delay circuit 21 delays the command pulse CMDP by a first delay time to generate the first input control pulse ICNTP1. In an embodiment, for example, the second pulse delay circuit 22 delays the first input control pulse ICNTP1 by a second delay time to generate the second input control pulse ICNTP2.

Figure 10:
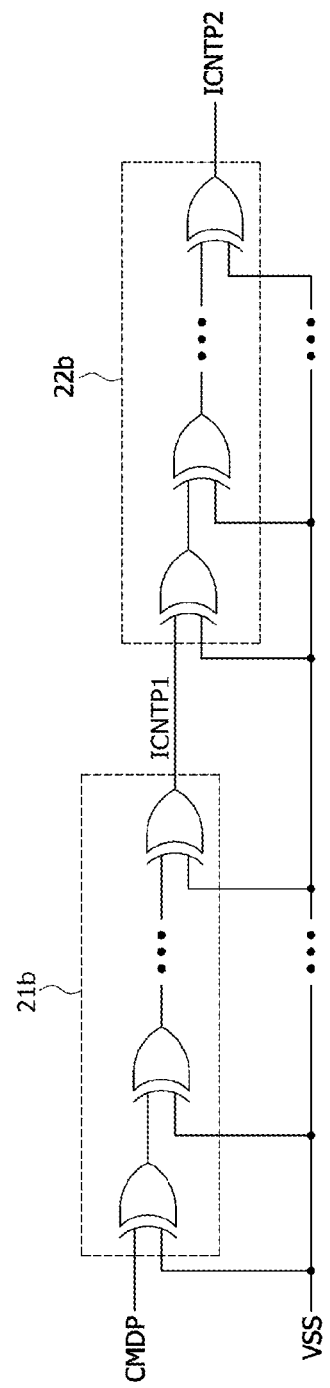
FIG. 10 is a circuit diagram illustrating an example of first and second pulse delay circuits included in the electronic device of FIG. 8.

Referring to FIG. 10, a first pulse delay circuit 21b corresponding to an example of the first pulse delay circuit 21 and a second pulse delay circuit 22b corresponding to an example of the second pulse delay circuit 22 are provided. Each of the first and second pulse delay circuits 21b and 22b may be configured to include an OR operator, for example but not limited to, a plurality of exclusive OR gates. The plurality of exclusive OR gates included in each of the first and second pulse delay circuits 21b and 22b may be coupled in series, and one of two input terminals of each exclusive OR gate may be coupled to a ground voltage VSS terminal. Thus, the first one of the plurality of exclusive OR gates included in the first pulse delay circuit 21b may directly receive the command pulse CMDP and the ground voltage VSS to perform an exclusive OR operation of the command pulse CMDP and the ground voltage VSS, and each of the second to last exclusive OR gates may receive an output signal of the previous exclusive OR gate and the ground voltage VSS to perform an exclusive OR operation of the output signal of the previous exclusive OR gate and the ground voltage VSS. Similarly, the first one of the plurality of exclusive OR gates included in the second pulse delay circuit 22b may directly receive the first input control pulse ICNTP1 (i.e., an output signal of the first pulse delay circuit 21b) and the ground voltage VSS to perform an exclusive OR operation of the first input control pulse ICNTP1 and the ground voltage VSS, and each of the second to last exclusive OR gates may receive an output signal of the previous exclusive OR gate and the ground voltage VSS to perform an exclusive OR operation of the output signal of the previous exclusive OR gate and the ground voltage VSS. Accordingly, the plurality of exclusive OR gates included in the first and second pulse delay circuits 21b and 22b may act as buffers. The number of the plurality of exclusive OR gates included in each of the first and second pulse delay circuits 21b and 22b may be set to be different according to the embodiments. The first input control pulse ICNTP1 may be generated at a point of time that a delay time set by the first pulse delay circuit 21b elapses from a point of time that the command pulse CMDP is created. The second input control pulse ICNTP2 may be generated at a point of time that a delay time set by the second pulse delay circuit 22b elapses from a point of time that the first input control pulse ICNTP1 is created.

Figure 11:
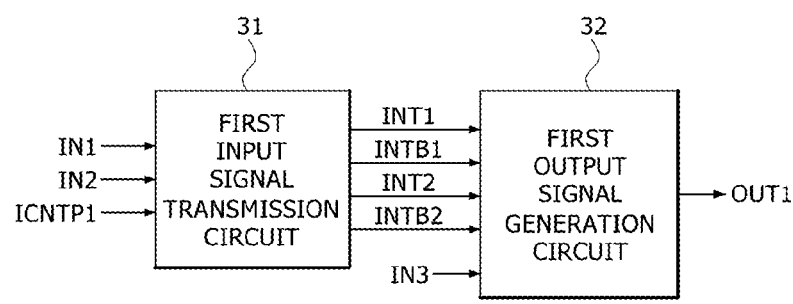
FIG. 11 is a block diagram illustrating an example of a first logic circuit included in the electronic device of FIG. 8.

Referring to FIG. 11, the first logic circuit 3 may include a first input signal transmission circuit 31 and a first output signal generation circuit 32.

The first input signal transmission circuit 31 may generate a first transmitted input signal INT1, a first complementary transmitted input signal INTB1, a second transmitted input signal INT2 and a second complementary transmitted input signal INTB2 from the first and second input signals IN1 and IN2, in response to the first input control pulse ICNTP1. The first input signal transmission circuit 31 may output the first and second input signals IN1 and IN2 as the first and second transmitted input signals INT1 and INT2 in synchronization with a point of time that the first input control pulse ICNTP1 is created. The first input signal transmission circuit 31 may inversely buffer the first and second transmitted input signals INT1 and INT2 to generate the first and second complementary transmitted input signals INTB1 and INTB2, in synchronization with a point of time that the first input control pulse ICNTP1 is created.

The first output signal generation circuit 32 may generate the first output signal OUT1 in response to the first transmitted input signal INT1, the first complementary transmitted input signal INTB1, the second transmitted input signal INT2, the second complementary transmitted input signal INTB2 and the third input signal IN3. The first output signal generation circuit 32 may receive the first transmitted input signal INT1, the second transmitted input signal INT2, and the third input signal IN3 and may perform an exclusive OR operation of the first transmitted input signal INT1, the second transmitted input signal INT2, and the third input signal IN3 to generate the first output signal OUT1.

Figure 12:
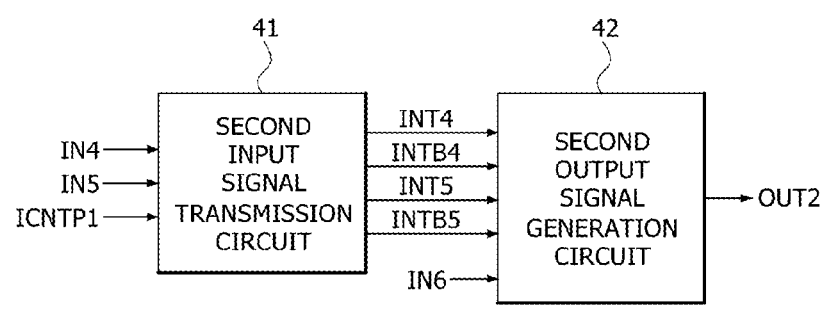
FIG. 12 is a block diagram illustrating an example of a second logic circuit included in the electronic device of FIG. 8.

Referring to FIG. 12, the second logic circuit 4 may include a second input signal transmission circuit 41 and a second output signal generation circuit 42.

The second input signal transmission circuit 41 may generate a fourth transmitted input signal INT4, a fourth complementary transmitted input signal INTB4, a fifth transmitted input signal INT5 and a fifth complementary transmitted input signal INTB5 from the fourth and fifth input signals IN4 and IN5, in response to the first input control pulse ICNTP1. The second input signal transmission circuit 41 may output the fourth and fifth input signals IN4 and IN5 as the fourth and fifth transmitted input signals INT4 and INT5 in synchronization with a point of time that the first input control pulse ICNTP1 is created. The second input signal transmission circuit 41 may inversely buffer the fourth and fifth transmitted input signals INT4 and INT5 to generate the fourth and fifth complementary transmitted input signals INTB4 and INTB5, in synchronization with a point of time that the first input control pulse ICNTP1 is created.

The second output signal generation circuit 42 may generate the second output signal OUT2 in response to the fourth transmitted input signal INT4, the fourth complementary transmitted input signal INTB4, the fifth transmitted input signal INT5, the fifth complementary transmitted input signal INTB5 and the sixth input signal IN6. The second output signal generation circuit 42 may receive the fourth transmitted input signal INT4, the fifth transmitted input signal INT5 and the sixth input signal IN6 and may perform an exclusive OR operation of the fourth transmitted input signal INT4, the fifth transmitted input signal INT5, and the sixth input signal IN6 to generate the second output signal OUT2.

Figure 13:
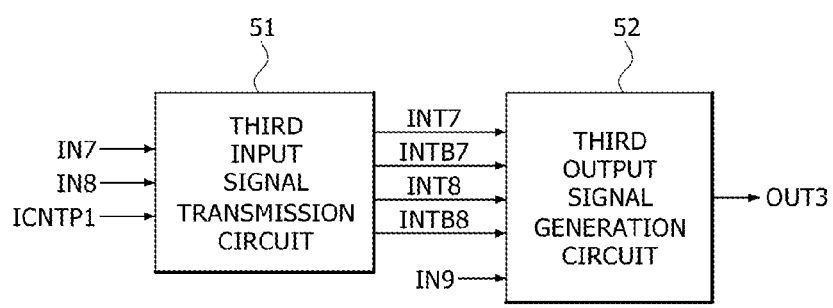
FIG. 13 is a block diagram illustrating an example of a third logic circuit included in the electronic device of FIG. 8.

Referring to FIG. 13, the third logic circuit 5 may include a third input signal transmission circuit 51 and a third output signal generation circuit 52.

The third input signal transmission circuit 51 may generate a seventh transmitted input signal INT7, a seventh complementary transmitted input signal INTB7, an eighth transmitted input signal INT8 and an eighth complementary transmitted input signal INTB8 from the seventh and eighth input signals IN7 and IN8, in response to the first input control pulse ICNTP1. The third input signal transmission circuit 51 may output the seventh and eighth input signals IN7 and IN8 as the seventh and eighth transmitted input signals INT7 and INT8 in synchronization with a point of time that the first input control pulse ICNTP1 is created. The third input signal transmission circuit 51 may inversely buffer the seventh and eighth transmitted input signals INT7 and INT8 to generate the seventh and eighth complementary transmitted input signals INTB7 and INTB8, in synchronization with a point of time that the first input control pulse ICNTP1 is created.

The third output signal generation circuit 52 may generate the third output signal OUT3 in response to the seventh transmitted input signal INT7, the seventh complementary transmitted input signal INTB7, the eighth transmitted input signal INT8, the eighth complementary transmitted input signal INTB8 and the ninth input signal IN9. The third output signal generation circuit 52 may receive the seventh transmitted input signal INT7, the eighth transmitted input signal INT8, and the ninth input signal IN9 and may perform an exclusive OR operation of the seventh transmitted input signal INT7, the eighth transmitted input signal INT8 and the ninth input signal IN9 to generate the third output signal OUT3.

Figure 14:
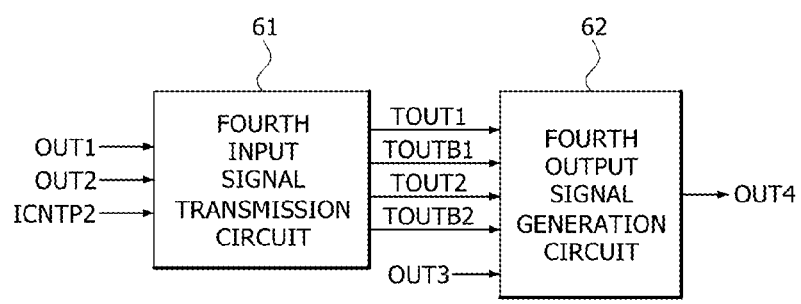
FIG. 14 is a block diagram illustrating an example of a fourth logic circuit included in the electronic device of FIG. 8.

Referring to FIG. 14, the fourth logic circuit 6 may include a fourth input signal transmission circuit 61 and a fourth output signal generation circuit 62.

The fourth input signal transmission circuit 61 may generate a first transmitted output signal TOUT1, a first complementary transmitted output signal TOUTB1, a second transmitted output signal TOUT2, and a second complementary transmitted output signal TOUTB2 from the first and second output signals OUT1 and OUT2, in response to the second input control pulse ICNTP2. The fourth input signal transmission circuit 61 may output the first and second output signals OUT1 and OUT2 as the first and second transmitted output signals TOUT1 and TOUT2 in synchronization with a point of time that the second input control pulse ICNTP2 is created. The fourth input signal transmission circuit 61 may inversely buffer the first and second transmitted output signals TOUT1 and TOUT2 to generate the first and second complementary transmitted output signals TOUTB1 and TOUTB2, in synchronization with a point of time that the second input control pulse ICNTP2 is created.

The fourth output signal generation circuit 62 may generate the fourth output signal OUT4 in response to the first transmitted output signal TOUT1, the first complementary transmitted output signal TOUTB1, the second transmitted output signal TOUT2, the second complementary transmitted output signal TOUTB2 and the third output signal OUT3. The fourth output signal generation circuit 62 may receive the first transmitted output signal TOUT1, the second transmitted output signal TOUT2 and the third output signal OUT3 and may perform an exclusive OR operation of the first transmitted output signal TOUT1, the second transmitted output signal TOUT2 and the third output signal OUT3 to generate the fourth output signal OUT4.

As described above, an electronic device according to an embodiment may fix logic levels of some input signals and may perform predetermined logical operations of some input signals having fixed logic levels and the remaining input signals, in synchronization with a first input control pulse and a second input control pulse which are sequentially created after a point of time that a command pulse is created to perform a read operation, a write operation or the like. As a result, a plurality of output signals (i.e., the first to fourth output signals OUT1, OUT2, OUT3 and OUT4) may be generated without any glitch to prevent malfunction of the electronic device. Thus, the electronic device may stably operate.

Figure 15:
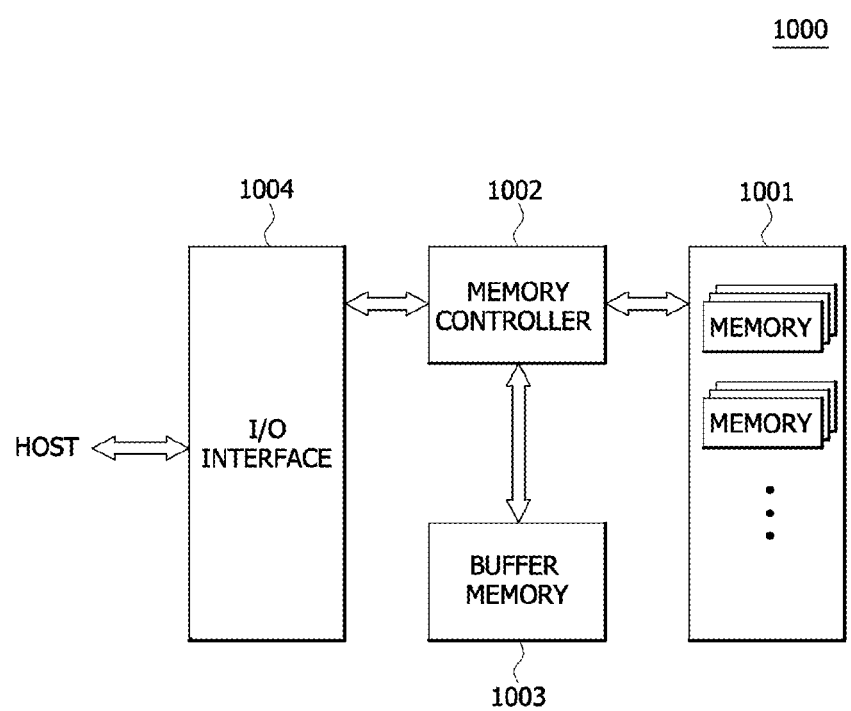
FIG. 15 is a block diagram illustrating a configuration an example of an electronic system employing at least one of the electronic devices illustrated in FIGS. 1 and 8.

The electronic devices described with reference to FIGS. 1 and 8 may be applied to an electronic system that includes a memory system, a graphic system, a computing system, a mobile system, or the like. For example, as illustrated in FIG. 15, an electronic system 1000 according an embodiment may include a data storage circuit 1001, a memory controller 1002, a buffer memory 1003, and an input and output (input/output) (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 15 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments described above, after level transition of input signals using a pulse stably occurs, a logical operation of the input signals may be performed to generate an output signal without any glitch. Thus, a stable logic circuit may be realized.

What is claimed is:

1. An electronic device comprising:
   a pulse delay circuit configured to generate an input control pulse based on a command pulse; and
   a logic circuit configured to output some input signals from a plurality of input signals as transmitted input signals based on the input control pulse while the input signals maintain a certain logic level combination and configured to perform a predetermined logical operation of the transmitted input signals according to a remaining input signal from the plurality of input signals to generate an output signal,
   wherein the command pulse is created to perform a write operation or a read operation,
   wherein some of the input signals from the plurality of input signals include a first input signal and a second input signal,
   wherein the transmitted input signals include a first transmitted input signal and a second transmitted input signal, and
   wherein the logic circuit includes an input signal transmission circuit configured to generate the first transmitted input signal, a first complementary transmitted input signal, the second transmitted input signal, and a second complementary transmitted input signal from the first and second input signals based on the input control pulse.

2. The electronic device of claim 1, wherein the pulse delay circuit delays the command pulse by a predetermined time to generate the input control pulse.

3. The electronic device of claim 1, wherein the pulse delay circuit is realized using an inverter chain circuit or a plurality of exclusive OR gates.

4. The electronic device of claim 1, wherein the predetermined logical operation is an exclusive OR operation.

5. The electronic device of claim 1, wherein the input signal transmission circuit outputs the first input signal as the first transmitted input signal and outputs the second input signal as the second transmitted input signal, in synchronization with a point of time that the input control pulse is created.

6. The electronic device of claim 1, wherein the input signal transmission circuit inversely buffers the first transmitted input signal to generate the first complementary transmitted input signal and inversely buffers the second transmitted input signal to generate the second complementary transmitted input signal.

7. The electronic device of claim 1,
   wherein the remaining input signal from the plurality of input signals includes a third input signal; and
   wherein the logic circuit further includes an output signal generation circuit configured to perform the predetermined logical operation of the first transmitted input signal, the first complementary transmitted input signal, the second transmitted input signal, the second complementary transmitted input signal, and the third input signal to generate the output signal.

8. The electronic device of claim 7, wherein the output signal generation circuit is configured to output the second transmitted input signal or the second complementary transmitted input signal to a first node based on the first transmitted input signal and the first complementary transmitted input signal, configured to output the second transmitted input signal or the second complementary transmitted input signal to a second node based on the first transmitted input signal and the first complementary transmitted input signal, and configured to buffer a signal of the first or second node to generate the output signal based on the third input signal.

9. An electronic device comprising:
a first pulse delay circuit configured to generate a first input control pulse based on a command pulse;
a second pulse delay circuit configured to generate a second input control pulse based on the first input control pulse;
a first logic circuit configured to perform a predetermined logical operation of first to third input signals in synchronization with the first input control pulse to generate a first output signal;
a second logic circuit configured to perform a predetermined logical operation of fourth to sixth input signals in synchronization with the first input control pulse to generate a second output signal;
a third logic circuit configured to perform a predetermined logical operation of seventh to ninth input signals in synchronization with the first input control pulse to generate a third output signal; and
a fourth logic circuit configured to perform a predetermined logical operation of the first to third output signals in synchronization with the second input control pulse to generate a fourth output signal.

10. The electronic device of claim 9, wherein the command pulse is created to perform a write operation or a read operation.

11. The electronic device of claim 9,
wherein the first pulse delay circuit delays the command pulse by a first delay time to generate the first input control pulse; and
wherein the second pulse delay circuit delays the first input control pulse by a second delay time to generate the second input control pulse.

12. The electronic device of claim 9, wherein each of the first and second pulse delay circuits are realized using an inverter chain circuit or a plurality of exclusive OR gates.

13. The electronic device of claim 9,
wherein the first logic circuit includes an input signal transmission circuit configured to generate a first transmitted input signal, a first complementary transmitted input signal, a second transmitted input signal, and a second complementary transmitted input signal from the first and second input signals based on the first input control pulse.

14. The electronic device of claim 13, wherein the input signal transmission circuit is configured to output the first input signal as the first transmitted input signal, configured to output the second input signal as the second transmitted input signal, configured to inversely buffer the first transmitted input signal to generate the first complementary transmitted input signal, and configured to inversely buffer the second transmitted input signal to generate the second complementary transmitted input signal, in synchronization with a point of time that the first input control pulse is created.

15. The electronic device of claim 13, wherein the first logic circuit further includes an output signal generation circuit configured to perform the predetermined logical operation of the first transmitted input signal, the first complementary transmitted input signal, the second transmitted input signal, the second complementary transmitted input signal, and the third input signal to generate the first output signal.

16. The electronic device of claim 9, wherein the second logic circuit includes:
an input signal transmission circuit configured to generate a fourth transmitted input signal, a fourth complementary transmitted input signal, a fifth transmitted input signal, and a fifth complementary transmitted input signal from the fourth and fifth input signals based on the first input control pulse; and
an output signal generation circuit configured to perform the predetermined logical operation of the fourth transmitted input signal, the fourth complementary transmitted input signal, the fifth transmitted input signal, the fifth complementary transmitted input signal, and the sixth input signal to generate the second output signal.

17. The electronic device of claim 9, wherein the third logic circuit includes:
an input signal transmission circuit configured to generate a seventh transmitted input signal, a seventh complementary transmitted input signal, an eighth transmitted input signal, and an eighth complementary transmitted input signal from the seventh and eighth input signals based on the first input control pulse; and
an output signal generation circuit configured to perform the predetermined logical operation of the seventh transmitted input signal, the seventh complementary transmitted input signal, the eighth transmitted input signal, the eighth complementary transmitted input signal, and the ninth input signal to generate the third output signal.

18. The electronic device of claim 9, wherein the fourth logic circuit includes:
an input signal transmission circuit configured to generate a first transmitted output signal, a first complementary transmitted output signal, a second transmitted output signal, and a second complementary transmitted output signal from the first and second output signals based on the second input control pulse; and
an output signal generation circuit configured to perform the predetermined logical operation of the first transmitted output signal, the first complementary transmitted output signal, the second transmitted output signal, the second complementary transmitted output signal, and the third output signal to generate the fourth output signal.

* * * * *